US012787603B2

(12) United States Patent
Jung et al.

(10) Patent No.: US 12,787,603 B2
(45) Date of Patent: Nov. 3, 2026

(54) WINDOW PANEL AND DISPLAY DEVICE INCLUDING THE SAME

(71) Applicant: Samsung Display Co., LTD., Yongin-si (KR)

(72) Inventors: Kyunghwan Jung, Yongin-si (KR); Hyorin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 656 days.

(21) Appl. No.: 18/345,435

(22) Filed: Jun. 30, 2023

(65) Prior Publication Data

US 2024/0164182 A1 May 16, 2024

(30) Foreign Application Priority Data

Nov. 10, 2022 (KR) ........................ 10-2022-0149412

(51) Int. Cl.
*H10K 59/80* (2023.01)

(52) U.S. Cl.
CPC ..... *H10K 59/8722* (2023.02); *H10K 59/8792* (2023.02)

(58) Field of Classification Search
CPC ....................... H10K 59/8722; H10K 59/8792
See application file for complete search history.

(56) References Cited

U.S. PATENT DOCUMENTS

| | | | | |
|---|---|---|---|---|
| 10,073,290 | B2 * | 9/2018 | Jin | B32B 27/36 |
| 2014/0300835 | A1 * | 10/2014 | Chu | G06F 3/0446 349/12 |
| 2020/0166965 | A1 * | 5/2020 | Shim | G02F 1/133512 |

FOREIGN PATENT DOCUMENTS

| | | |
|---|---|---|
| KR | 10-1336934 | 12/2013 |
| KR | 10-1736986 | 5/2017 |
| KR | 10-1787570 | 11/2017 |
| KR | 10-2018-0074270 | 7/2018 |
| KR | 10-2004220 | 7/2019 |
| KR | 10-2021-0011551 | 2/2021 |

* cited by examiner

*Primary Examiner* — Dale E Page
*Assistant Examiner* — Colleen E Snow
(74) *Attorney, Agent, or Firm* — Sughrue Mion, PLLC

(57) ABSTRACT

A window panel includes a window substrate including a transmission area through which light is transmitted and a non-transmission area adjacent to the transmission area, a first printed layer disposed on a surface of the window substrate in the non-transmission area, and a second printed layer covering upper and side surfaces of the first printed layer, disposed in the non-transmission area, and defining a boundary line between the transmission area and the non-transmission area.

19 Claims, 7 Drawing Sheets

WINDOW PANEL AND DISPLAY DEVICE INCLUDING THE SAME

CROSS-REFERENCE TO RELATED APPLICATION(S)

This application claims priority to and benefits of Korean Patent Application No. 10-2022-0149412 under 35 USC § 119, filed on Nov. 10, 2022, in the Korean Intellectual Property Office (KIPO), the entire contents of which are incorporated herein by reference.

BACKGROUND

1. Technical Field

The disclosure relates generally to a window panel and a display device including the same.

2. Description of the Related Art

With the development of information technology, the importance of a display device, which is a connection medium between a user and information, has been highlighted. For example, the use of display devices such as liquid crystal display device ("LCD"), organic light emitting display device ("OLED"), plasma display panel device ("PDP"), quantum dot display device or the like is increasing.

A printed layer for blocking light leakage that may occur at an edge of the display device may be disposed on a window panel protecting a display panel. When the display panel and the window panel are bonded together, bubble defect in which bubble remains between the display panel and the window panel may occur due to an offset of the printed layer included in the window panel. Such a bubble defect may cause adhesion failure between the display panel and the window panel or touch failure of a touch sensor included in the display panel.

SUMMARY

Embodiments provide a window panel with reduced bubble defect.

Embodiments provide a display device including the window panel.

According to an embodiment of the disclosure, a window may include a window substrate including a transmission area through which light is transmitted and a non-transmission area adjacent to the transmission area, a first printed layer disposed on a surface of the window substrate in the non-transmission area, and a second printed layer covering upper and side surfaces of the first printed layer, disposed in the non-transmission area, and defining a boundary line between the transmission area and the non-transmission area.

In an embodiment, the non-transmission area may include a first non-transmission area adjacent to the transmission area and a second non-transmission area adjacent to an edge of the window substrate, and a side surface of the second printed layer may include an inclined surface inclined with respect to the surface of the window substrate in the first non-transmission area.

In an embodiment, the inclined surface may be a concave surface having a gradually increasing inclined angle with respect to the surface of the window substrate from the boundary line toward the second non-transmission area.

In an embodiment, wherein the inclined surface may be a convex surface having a gradually decreasing inclined angle with respect to the surface of the window substrate from the boundary line toward the second non-transmission area.

In an embodiment, each of the first printed layer and the second printed layer may include an inorganic material or an organic material including a black light blocking material.

In an embodiment, the window substrate may include a curved surface such that the surface of the window substrate is concave in the non-transmission area.

In an embodiment, the inclined surface may be a concave surface having a gradually increasing inclined angle with respect to the surface of the window substrate from the boundary line toward the second non-transmission area.

In an embodiment, the inclined surface may be a convex surface having a gradually decreasing inclined angle with respect to the surface of the window substrate from the boundary line toward the second non-transmission area.

In an embodiment, the window substrate may include a curved surface such that the surface of the window substrate is convex in the non-transmission area.

In an embodiment, the inclined surface may be a concave surface having a gradually increasing inclined angle with respect to the surface of the window substrate from the boundary line toward the second non-transmission area.

In an embodiment, the inclined surface may be a convex surface having a gradually decreasing inclined angle with respect to the surface of the window substrate from the boundary line to the second non-transmission area.

In an embodiment, the first printed layer may include a first sub-printed layer and a second sub-printed layer disposed on the first sub-printed layer and the second printed layer may include a third sub-printed layer and a fourth sub-printed layer disposed on the third sub-printed layer and the third sub-printed layer may cover upper and side surfaces of the first sub-printed layer, and the fourth sub-printed layer may cover upper and side surfaces of the second sub-printed layer.

In an embodiment, the second printed layer may include a first sub-printed layer, a second sub-printed layer, and a third sub-printed layer sequentially disposed, the first sub-printed layer may cover the upper and side surfaces of the first printed layer, the second sub-printed layer may cover upper and side surfaces of the first sub-printed layer, and the third sub-printed layer may cover upper and side surfaces of the second sub-printed layer.

According to an embodiment of the disclosure, a display device may include a display panel including a display area including a pixel and a non-display area disposed adjacent to the display area, a window substrate including a transmission area corresponding to the display area and a non-transmission area corresponding to the non-display area, a first printed layer disposed on a surface of the window substrate in the non-transmission area, and a second printed layer covering upper and side surfaces of the first printed layer, disposed in the non-transmission area, and defining a boundary line between the transmission area and the non-transmission area.

In an embodiment, the non-transmission area may include a first non-transmission area adjacent to the transmission area and a second non-transmission area adjacent to an edge of the window substrate, and a side surface of the second printed layer may include an inclined surface inclined with respect to the surface of the window substrate in the first non-transmission area.

In an embodiment, each of the first printed layer and the second printed layer may include an inorganic material or an organic material including a black light blocking material.

In an embodiment, the window substrate may include a curved surface such that the surface of the window substrate is concave in the non-transmission area.

In an embodiment, the window substrate may include a curved surface such that the surface of the window substrate is convex in the non-transmission area.

In an embodiment, the first printed layer may include a first sub-printed layer and a second sub-printed layer disposed on the first sub-printed layer and the second printed layer may include a third sub-printed layer and a fourth sub-printed layer disposed on the third sub-printed layer and the third sub-printed layer may cover upper and side surfaces of the first sub-printed layer, and the fourth sub-printed layer may cover upper and side surfaces of the second sub-printed layer.

In an embodiment, the second printed layer may include a first sub-printed layer, a second sub-printed layer, and a third sub-printed layer sequentially disposed, the first sub-printed layer may cover the upper and side surfaces of the first printed layer, the second sub-printed layer may cover upper and side surfaces of the first sub-printed layer, and the third sub-printed layer may cover upper and side surfaces of the second sub-printed layer.

According to an embodiment of the disclosure, a window panel may include a window substrate including a transmission area through which light is transmitted and a non-transmission area adjacent to the transmission area, a first printed layer disposed on a of the window substrate in the non-transmission area, and a second printed layer covering upper and side surfaces of the first printed layer, disposed in the non-transmission area, and defining a boundary line between the transmission area and the non-transmission area.

A side surface of the second printed layer may include an inclined surface. Since the side surface of the second printed layer includes an inclined surface, an adhesive may be entirely disposed on the side surface of the second printed layer, and a display panel may be strongly bonded to the window panel. Accordingly, bubble defect that may occur due to an offset of the printed layer may be prevented.

Also, since the side surface of the second printed layer includes an inclined surface, a thin adhesive may be applied.

In the disclosure, by forming the length of the second printed layer greater than the length of the first printed layer, the side surface of the second printed layer may include an inclined surface. For example, a separate pressing process may not be required to form an inclined surface of the printed layer. Accordingly, the process cost of the window panel may be reduced.

BRIEF DESCRIPTION OF THE DRAWINGS

Illustrative, non-limiting embodiments will be more clearly understood from the following detailed description in conjunction with the accompanying drawings.

Figure 1:
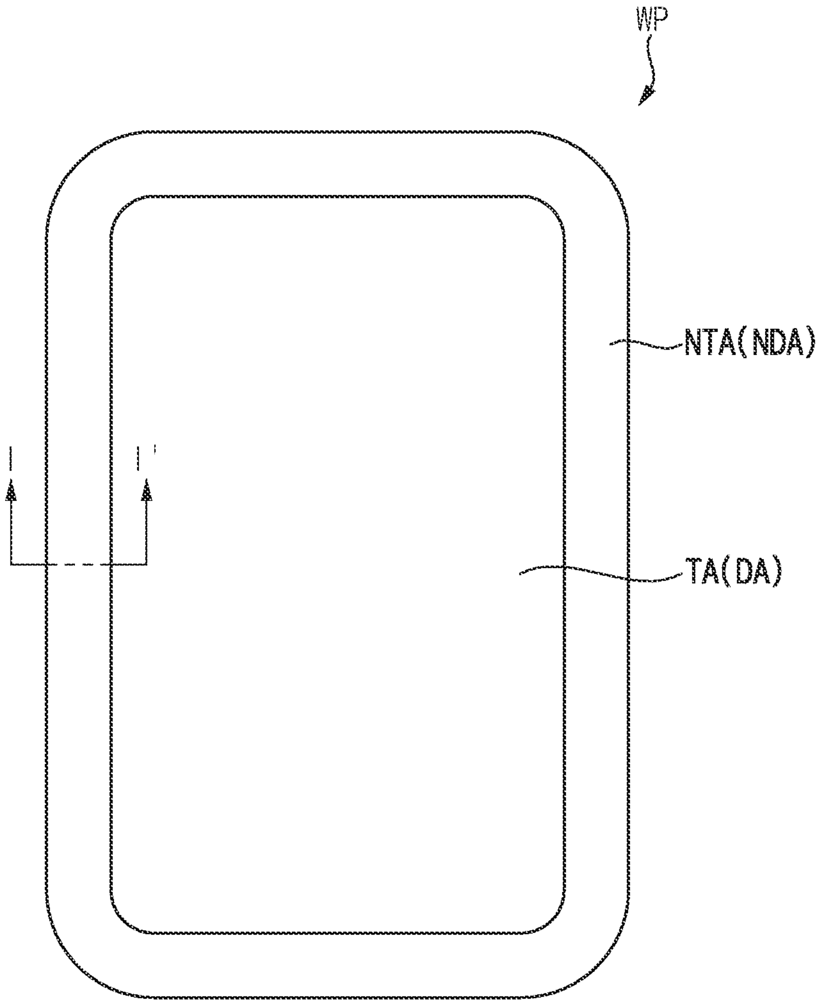
FIG. 1 is a plan view illustrating a window panel according to an embodiment.

7 is a schematic cross-sectional view illustrating a window panel taken along line I-I' of FIG. 1 according to an embodiment.

Figure 8:
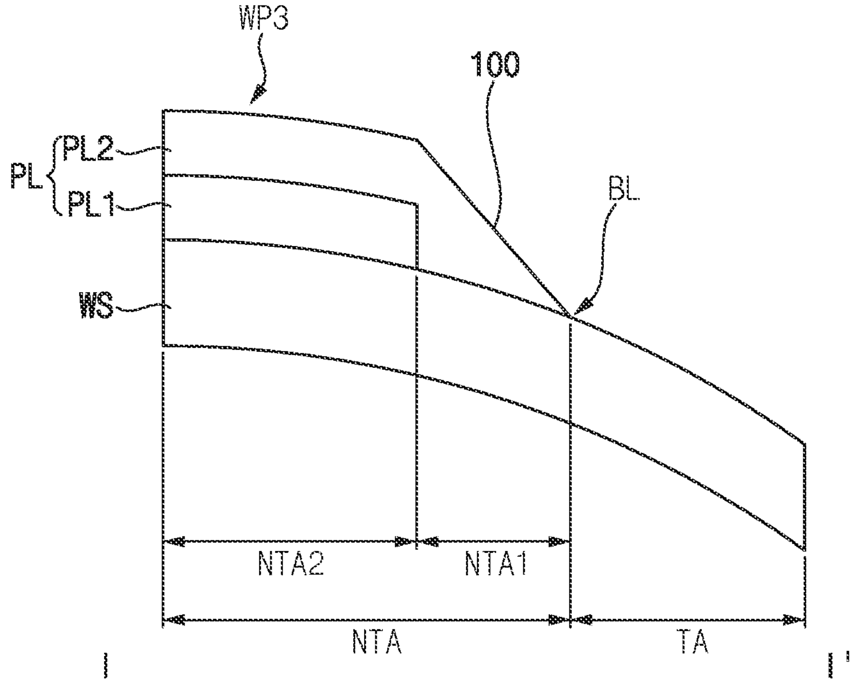

FIG. 8 is a schematic cross-sectional view illustrating a window panel taken along line I-I' of FIG. 1 according to an embodiment.

Figure 9:
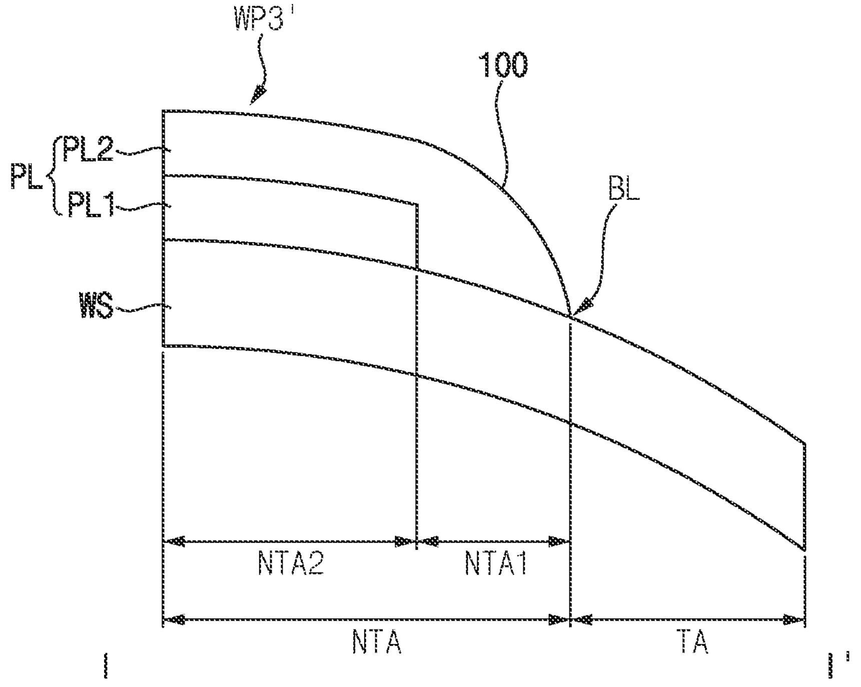

FIG. 9 is a schematic cross-sectional view illustrating a window panel taken along line I-I' of FIG. 1 according to an embodiment.

10 is a schematic cross-sectional view illustrating a window panel taken along line I-I' of FIG. 1 according to an embodiment.

Figure 11:
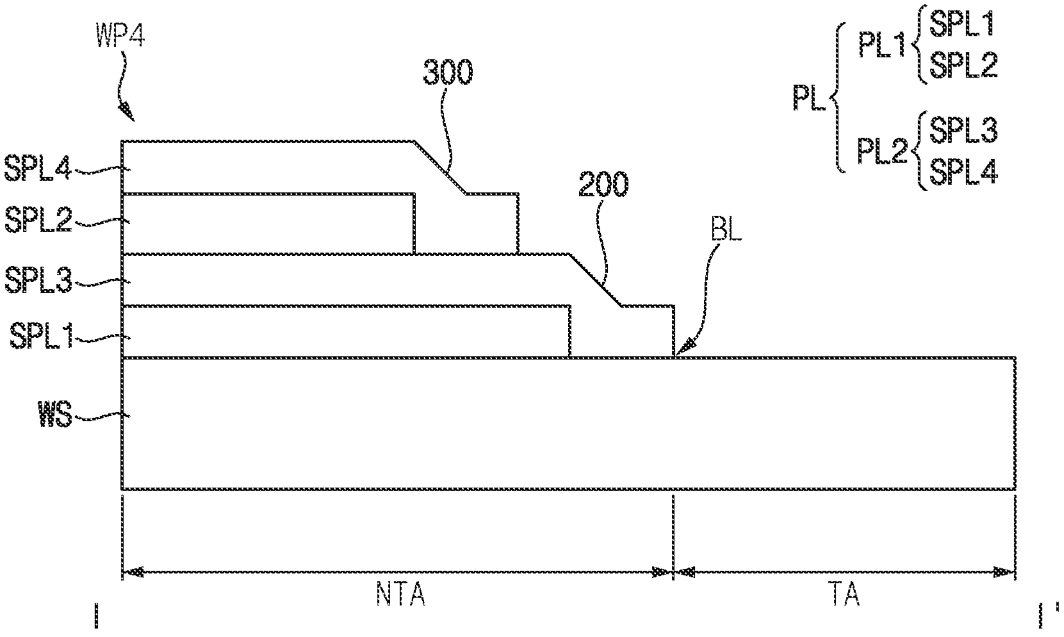

FIG. 11 is a schematic cross-sectional view illustrating a window panel taken along line I-I' of FIG. 1 according to an embodiment.

12 is a schematic cross-sectional view illustrating a window panel taken along line I-I' of FIG. 1 according to an embodiment.

Figure 13:
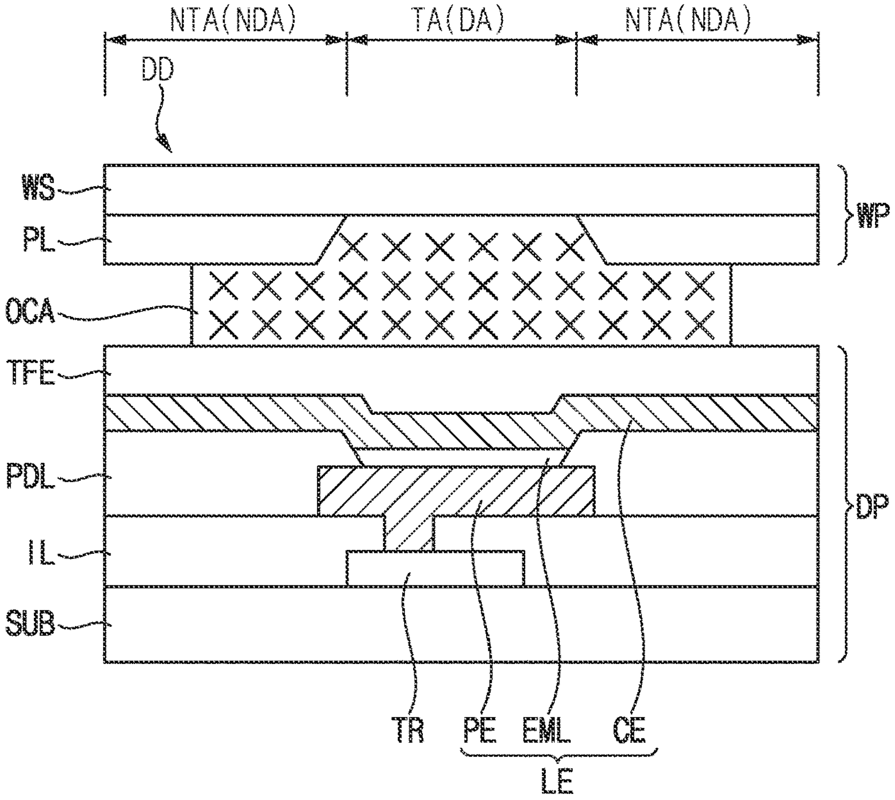

FIG. 13 is a schematic cross-sectional view illustrating a display device according to an embodiment.

DETAILED DESCRIPTION OF THE EMBODIMENTS

Hereinafter, a window panel and a display device including the same according to embodiments of the disclosure will be explained in detail with reference to the accompanying drawings. The same reference numerals are used for the same components in the drawings, and redundant descriptions of the same components will be omitted.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a plan view illustrating a window panel according to an embodiment.

Referring to FIG. 1, a display device may include a window panel WP and a display panel bonded to the window panel WP.

The window panel WP may include a transmission area TA and a non-transmission area NTA. The transmission area TA may be defined as an area through which an image displayed on the display panel is transmitted toward a user. The non-transmission area NTA may be located adjacent to the transmission area TA. As shown in FIG. 1, the non-transmission area NTA may be located to surround the edge of the transmission area TA.

FIG. 1 shows a rear surface of the window panel WP. The display panel may be bonded to the rear surface of the window panel WP. An area of the display panel bonded to the rear surface of the window panel WP may be defined as a display panel area. The display panel area may entirely overlap the transmission area TA and partially overlap the non-transmission area NTA in a plan view. In an embodiment, the display panel may be bonded to the window panel WP so as to entirely overlap the transmission area TA and partially overlap the non-transmission area NTA in a plan view. In another embodiment, the display panel may be bonded to the window panel WP so as to entirely overlap the transmission area TA and non-transmission area NTA in a plan view. The display device in which the display panel is bonded to the window panel WP will be described below with reference to FIG. 13.

The transmission area TA may correspond to the display area DA of the display panel, and the non-transmission area NTA may correspond to the non-display area NDA of the display panel. The display area DA may entirely overlap the transmission area TA and the non-display area NDA may partially or entirely overlap the non-transmission area NTA in a plan view.

The display area DA may include multiple pixels and may be defined as an area where an image is displayed. The non-display area NDA may be disposed adjacent to the display area DA. A driving circuit and wires for transmitting signals to the pixels may be disposed in the non-display area NDA.

A printed layer may be disposed in the non-transmission area NTA to block driving circuits and wires located in the non-display area NDA from being recognized by a user. The printed layer may block light leakage that may occur at an edge of the display device.

Figure 2:
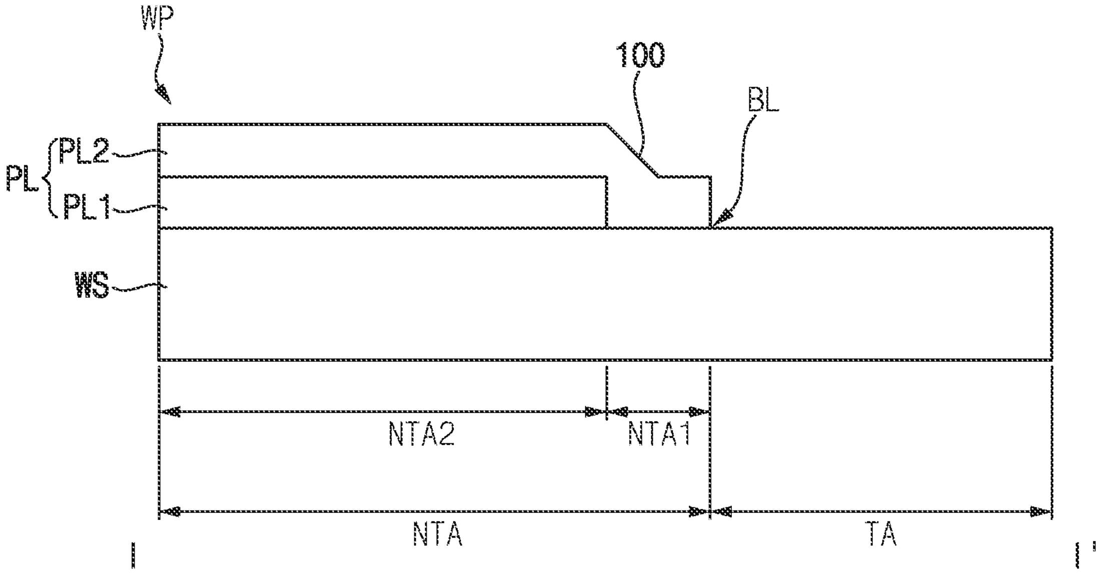
FIG. 2 is a schematic cross-sectional view illustrating a window panel taken along line I-I' of FIG. 1 according to an embodiment.

FIG. 2 is a schematic cross-sectional view taken along line I-I' of FIG. 1 according to an embodiment. For example, FIG. 2 is a schematic cross-sectional view illustrating an embodiment in which a window substrate WS includes a flat surface.

Referring to FIG. 2, the window panel WP according to an embodiment of the disclosure may include a window substrate WS and the printed layer PL. The printed layer PL may include a first printed layer PL1 and a second printed layer PL2.

As described above, the window panel WP may include the transmission area TA and the non-transmission area NTA. As the window panel WP may include the transmission area TA and the non-transmission area NTA, the window substrate WS may also include the transmission area TA and the non-transmission area NTA.

The window substrate WS may include a transparent glass or plastic. In an embodiment, the window substrate WS may include a flat surface in the transmission area TA and the non-transmission area NTA. In another embodiment, the window substrate WS may include a curved surface in a portion of the transmission area TA and the entire non-transmission area NTA. This will be described below with reference to FIGS. 5, 6, 7, 8, 9, and 10.

The printed layer PL may include an inorganic material and/or an organic material. For example, the organic material may include a photoresist, a polyacryl-based resin, a polyimide-based resin, a polyamide-based resin, a siloxane-based resin, an acryl-based resin, an epoxy-based resin, etc. These may be used alone or in combination with each other.

The printed layer PL may block external light. In an embodiment, the printed layer PL may include an inorganic material and/or an organic material including a black light blocking material. For example, the light blocking material may include black pigment, black dye, carbon black, etc. These may be used alone or in combination with each other. In another embodiment, the printed layer PL may have a color other than black.

The printed layer PL may be formed by various methods such as an ink method, a vapor deposition method, a screen printing method, etc. The printed layer may have insufficient light blocking property in case that a bright color such as white light is applied and, a phenomenon in which light transmits to the window substrate WS may occur. In order to prevent this, the printed layer PL having a desired thickness may be formed by stacking raw materials for the printed layer PL several times.

The first printed layer PL1 and the second printed layer PL2 may be disposed on the rear surface of the window substrate WS in the non-transmission area NTA. A front surface opposite to the rear surface of the window substrate WS may be a surface facing the user. The front surface of the window substrate WS may be referred to as an outer surface and the rear surface of the window substrate WS may be referred to as an inner surface.

The non-transmission area NTA may include a first non-transmission area NTA1 adjacent to the transmission area TA and a second non-transmission area NTA2 adjacent to an edge of the window substrate WS. The first non-transmission area NTA1 may be located between the transmission area TA and the second non-transmission area NTA2. A boundary dividing the transmission area TA and the non-transmission area NTA may be defined as a boundary line BL.

The first printed layer PL1 may be disposed on the rear surface of the window substrate WS in the non-transmission area NTA. For example, the first printed layer PL1 may overlap the second non-transmission area NTA2 in a plan view and may be disposed between the window substrate WS and the second printed layer PL2 in the second non-transmission area NTA2. The thickness of the first printed layer PL1 may be in a range of about 5 micrometers to about 10 micrometers in a thickness direction of the window substrate WS depending on the printing method.

The second printed layer PL2 may be disposed on the rear surface of the window substrate WS in the non-transmission area NTA. The second printed layer PL2 may overlap the entire non-transmission area NTA in a plan view. For example, the second printed layer PL2 may be disposed on the first printed layer PL1 in the second non-transmission area NTA2 and disposed on the rear surface of the window substrate WS in the first non-transmission area NTA1. The second printed layer PL2 may extend from the edge of the window substrate WS to the boundary line BL. For example, the second printed layer PL2 may define the boundary line BL dividing the transmission area TA and the non-transmission area NTA. The second printed layer PL2 may serve to reinforce the first printed layer PL1. The thickness of the second printed layer PL2 may be in a range of about 5 micrometers to about 10 micrometers in the thickness direction of the window substrate WS depending on the printing method.

The first printed layer PL1 and the second printed layer PL2 may be formed parallel to the rear surface of the window substrate WS in the second non-transmission area NTA2. The second printed layer PL2 may cover the upper and side surfaces of the first printed layer PL1 in the non-transmission area NTA.

Accordingly, in an embodiment, a side surface 100 of the second printed layer PL2 may include an inclined surface inclined with respect to the rear surface of the window substrate WS in the first non-transmission area NTA1. The side surface 100 of the second printed layer PL2 may be defined as a surface extending from the end of an upper surface of the second printed layer PL2 corresponding to the side surface of the first printed layer PL1 to the rear surface of the window substrate WS. The inclined surface may have an inclined angle less than a right angle with respect to the rear surface of the window substrate WS. As shown in FIG. 2, the inclined surface may be a flat surface having a constant inclined angle with respect to the rear surface of the window substrate in the first non-transmission area NTA1. However, the configuration of the disclosure is not limited thereto, and the inclined surface may be a curved surface with the inclined angle changes from the boundary line BL toward the second non-transmission area NTA2.

In other words, a lower surface of the first printed layer PL1 contacting the window substrate WS may extend from the edge of the window substrate WS to between the first non-transmission area NTA1 and the second non-transmission area NTA2. An area of the upper surface of the first printed layer PL1 and an area of the lower surface of the first printed layer PL1 may be same in a plan view. The lower surface of the second printed layer PL2 may contact the upper surface of the first printed layer PL1 in the second non-transmission layer NTA2. Also, the lower surface of the second printed layer PL2 may contact the rear surface of the window substrate WS in the first non-transmission layer NTA1. The upper surface of the second printed layer PL2 may extend from the edge of the window substrate WS to between the first non-transmission area NTA1 and the second non-transmission area NTA2.

In case that there is an offset (i.e., step difference) between the printed layers PL due to the length difference between the first printed layer PL1 and the second printed layer PL2, an optically clear adhesive tape ("OCA tape") may be separated from the window panel WP, and thus the bubble defect may occur adjacent to the boundary line BL. Such a bubble defect may cause adhesion failure between the display panel and the window panel WP or touch failure of the touch sensor included in the display panel.

In the disclosure, in order to prevent this, the side surface 100 of the second printed layer PL2 may include an inclined surface inclined with respect to the rear surface of the window substrate WS in the first non-transmission area NTA1. As such, since the side surface 100 of the second printed layer PL2 includes an inclined surface, the optically clear adhesive tape may be entirely formed on the side surface 100 of the second printed layer PL2, and the display panel may be bonded to the window panel WP without gaps. Accordingly, the bubble defect that may occur in the vicinity of the boundary line BL due to the offset of the printed layer PL may be prevented. Since the side surface 100 of the second printed layer PL2 includes an inclined surface, a thin optically clear adhesive tape may be applied.

Also, in the disclosure, by forming the length of the second printed layer PL2 greater than the length of the first printed layer PL1, the side surface 100 of the second printed layer PL2 may include the inclined surface. For example, a separate pressing process may not be required to form the inclined surface of the printed layer PL. Consequently, the process cost of the window panel WP may be reduced.

In the above, it is described that the printed layer PL may include the first printed layer PL1 and the second printed layer PL2, but embodiments of the disclosure are not limited thereto. In another embodiment, the printed layer PL may include multiple printed layers of three or more. This will be described below with reference to FIGS. 11 and 12.

Figure 3:
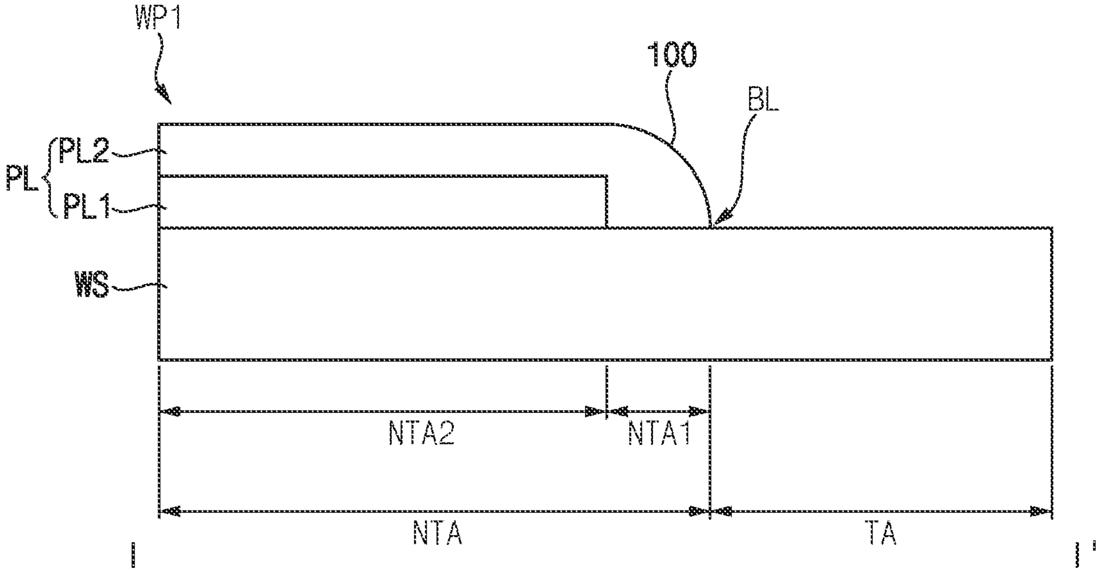
FIG. 3 is a schematic cross-sectional view illustrating a window panel taken along line I-I' of FIG. 1 according to an embodiment.
Figure 4:
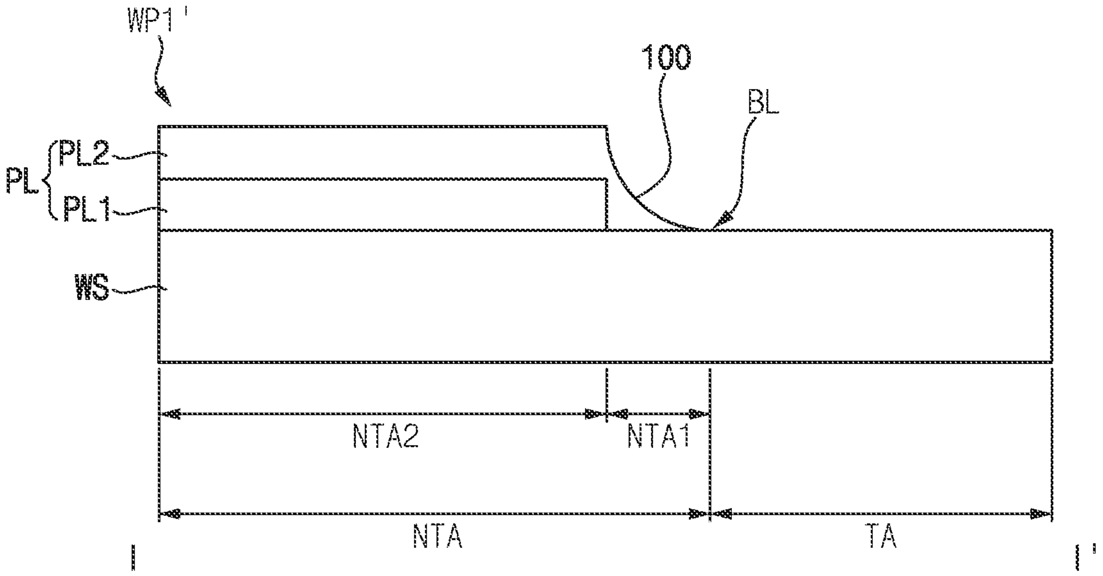
FIG. 4 is a schematic cross-sectional view illustrating a window panel taken along line I-I' of FIG. 1 according to an embodiment.

FIGS. 3 and 4 are schematic cross-sectional views illustrating a window panel taken along line I-I' of FIG. 1 according to an embodiment. For example, FIGS. 3 and 4 are schematic cross-sectional views illustrating embodiments in which the window substrate includes a flat surface. Hereinafter, descriptions overlapping with descriptions of the window panel WP described with reference to FIG. 2 will be omitted or simplified.

Referring to FIG. 3, according to an embodiment, a window panel WP1 may include the first printed layer PL1 and the second printed layer PL2. The inclined surface on the side surface 100 of the second printed layer PL2 may be a convex surface that is convex toward the transmission area TA. For example, as shown in FIG. 3, the inclined surface may be a convex surface having a gradually decreasing inclined angle from the boundary line BL toward the second non-transmission area NTA2 in the first non-transmission area NTA1.

Referring to FIG. 4, according to an embodiment, a window panel WP1' may include the first printed layer PL1 and the second printed layer PL2. The inclined surface on the side surface 100 of the second printed layer PL2 may be a concave surface that is concave toward the edge of the window substrate WS. For example, as shown in FIG. 4, the inclined surface may be a concave surface having a gradually increasing inclined angle from the boundary line BL toward the second non-transmission area NTA2 in the first non-transmission area NTA1.

Figure 5:
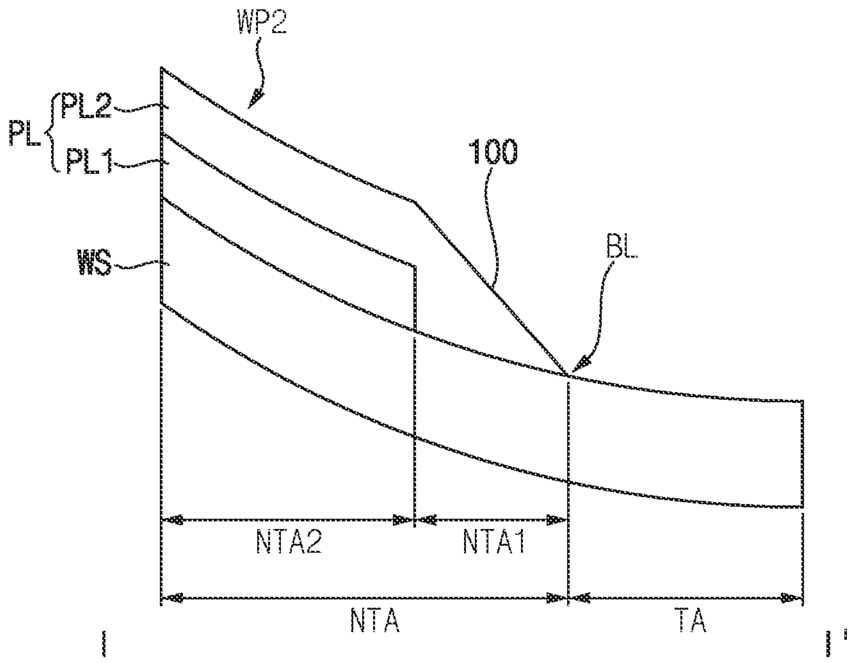
FIG. 5 is a schematic cross-sectional view illustrating a window panel taken along line I-I' of FIG. 1 according to an embodiment.

FIG. 5 is a schematic cross-sectional view illustrating a window panel taken along line I-I' of FIG. 1 according to an embodiment. For example, FIG. 5 is a schematic cross-sectional view illustrating an embodiment in which the edge of the window substrate WS includes a curved surface. Hereinafter, descriptions overlapping with descriptions of the window panel WP described with reference to FIG. 2 will be omitted or simplified.

Referring to FIG. 5, according to an embodiment, a window panel WP2 may include the window substrate WS and the printed layer PL, and a portion of the window substrate WS may include a curved surface. For example, a portion of the window substrate WS may be bent. For example, as shown in FIG. 5, the rear surface of the window substrate WS may be concave or the front surface of the window substrate WS may be convex in the non-transmission area NTA and a portion of the transmission area TA adjacent to the non-transmission area NTA. Although not shown in FIG. 5, the window substrate WS in the transmission area TA may include a flat surface except for the portion adjacent to the non-transmission area NTA.

The first printed layer PL1 and the second printed layer PL2 may include a curved surface corresponding to the curved surface of the window substrate WS in the non-transmission area NTA. The side surface 100 of the second printed layer PL2 may include an inclined surface inclined with respect to the rear surface of the window substrate WS in the first non-transmission area NTA1. The inclined surface may have an inclined angle less than a right angle with respect to the rear surface of the window substrate WS. As shown in FIG. 5, the inclined surface may be a flat surface having a constant inclined angle with respect to the rear surface of the window substrate WS in the first non-transmission area NTA1. However, the configuration of the disclosure is not limited thereto, and the inclined surface may be a curved surface with the inclined angle changes from the boundary line BL toward the second non-transmission area NTA2.

Figure 6:
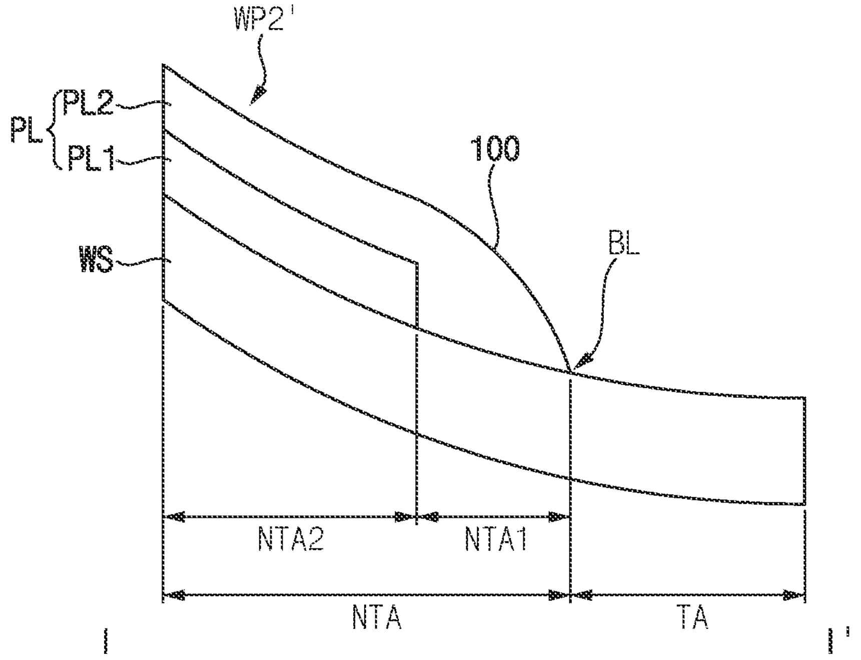
FIG. 6 is a schematic cross-sectional view illustrating a window panel taken along line I-I' of FIG. 1 according to an embodiment.
Figure 7:
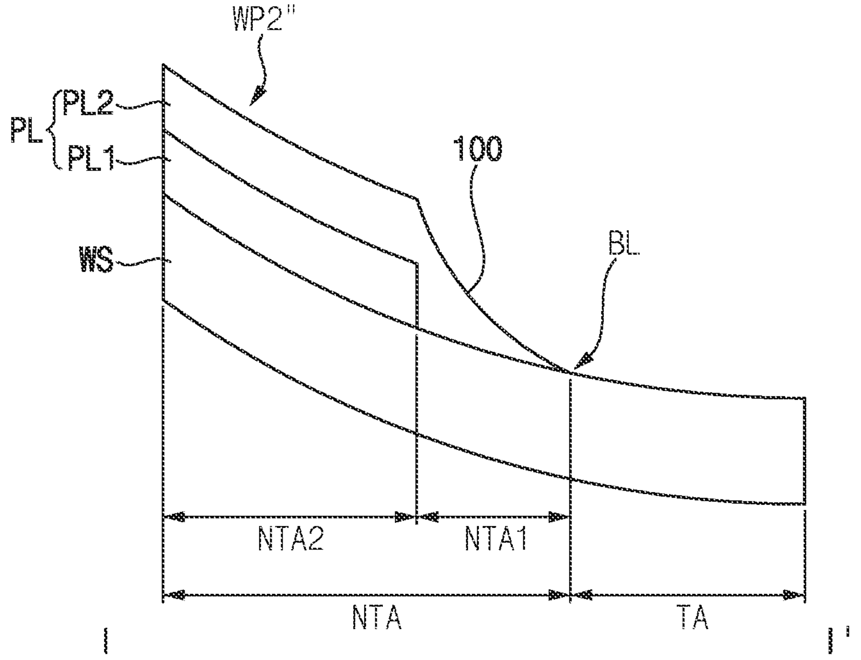

FIGS. 6 and 7 are schematic cross-sectional views illustrating a window panel taken along line I-I' of FIG. 1 according to an embodiment. For example, FIGS. 6 and 7 are schematic cross-sectional views illustrating embodiments in which the edge of the window substrate WS includes a curved surface. Hereinafter, descriptions overlapping descriptions of the window panel WP2 described with reference to FIG. 5 will be omitted or simplified.

Referring to FIG. 6, according to an embodiment, a window panel WP2' may include the first printed layer PL1 and the second printed layer PL2. The inclined surface on the side surface 100 of the second printed layer PL2 may be a convex surface that is convex toward the transmission area TA. For example, as shown in FIG. 6, the inclined surface may be a convex surface having a gradually decreasing inclined angle from the boundary line BL toward the second non-transmission area NTA2 in the first non-transmission area NTA1.

Referring to FIG. 7, according to an embodiment, a window panel WP2" may include the first printed layer PL1 and the second printed layer PL2. The inclined surface on the side surface 100 of the second printed layer PL2 may be a concave surface that is concave toward the edge of the window substrate WS. For example, as shown in FIG. 7, the inclined surface may be a concave surface having a gradually increasing inclined angle from the boundary line BL toward the second non-transmission area NTA2 in the first non-transmission area NTA1.

FIG. 8 is a schematic cross-sectional view illustrating a window panel taken along line I-I' of FIG. 1 according to an embodiment. For example, FIG. 8 is a schematic cross-sectional view illustrating an embodiment in which the edge of the window substrate WS includes a curved surface. Hereinafter, descriptions overlapping with descriptions of the window panel WP described with reference to FIG. 2 will be omitted or simplified.

Referring to FIG. 8, according to an embodiment, a window panel WP3 may include the window substrate WS and the printed layer PL, and a portion of the window substrate WS may include a curved surface. For example, a portion of the window substrate WS may be bent. For example, as shown in FIG. 8, the rear surface of the window substrate WS may be convex or the front surface of the window substrate WS may be concave in the non-transmission area NTA and a portion of the transmission area TA adjacent to the non-transmission area NTA. Although not shown in FIG. 8, the window substrate WS in the transmission area TA may include a flat surface except for the portion adjacent to the non-transmission area NTA.

The first printed layer PL1 and the second printed layer PL2 may include a curved surface corresponding to the curved surface of the window substrate WS in the non-transmission area NTA. The side surface 100 of the second printed layer PL2 may include an inclined surface inclined with respect to the rear surface of the window substrate WS in the first non-transmission area NTA1. The inclined surface may have an inclined angle less than a right angle with respect to the rear surface of the window substrate WS. As shown in FIG. 8, the inclined surface may be a flat surface having a constant inclined angle with respect to the rear surface of the window substrate WS in the first non-transmission area NTA1. However, the configuration of the disclosure is not limited thereto, and the inclined surface may be a curved surface with the inclined angle changes from the boundary line BL toward the second non-transmission area NTA2.

Figure 10:
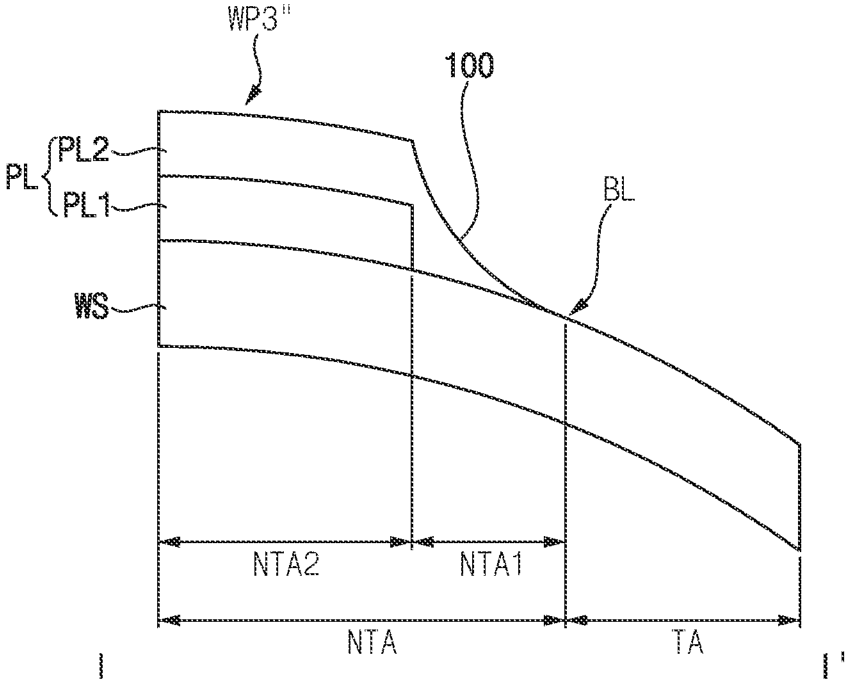

FIGS. 9 and 10 are schematic cross-sectional views illustrating a window panel taken along line I-I' of FIG. 1 according to an embodiment. For example, FIGS. 9 and 10 are schematic cross-sectional views illustrating embodiments in which the edge of the window substrate WS includes a curved surface. Hereinafter, descriptions overlapping descriptions of the window panel WP3 described with reference to FIG. 8 will be omitted or simplified.

Referring to FIG. 9, according to an embodiment, a window panel WP3' may include the first printed layer PL1 and the second printed layer PL2. The inclined surface on the side surface 100 of the second printed layer PL2 may be a convex surface that is convex toward the transmission area TA. For example, as shown in FIG. 9, the inclined surface may be a convex surface having a gradually decreasing inclined angle from the boundary line BL toward the second non-transmission area NTA2 in the first non-transmission area NTA1.

Referring to FIG. 10, according to an embodiment, a window panel WP3" may include the first printed layer PL1 and the second printed layer PL2. The inclined surface on the side surface 100 of the second printed layer PL2 may be a concave surface that is concave toward the edge of the window substrate WS. For example, as shown in FIG. 10, the inclined surface may be a concave surface having a gradually increasing inclined angle from the boundary line BL toward the second non-transmission area NTA2 in the first non-transmission area NTA1.

Figure 12:
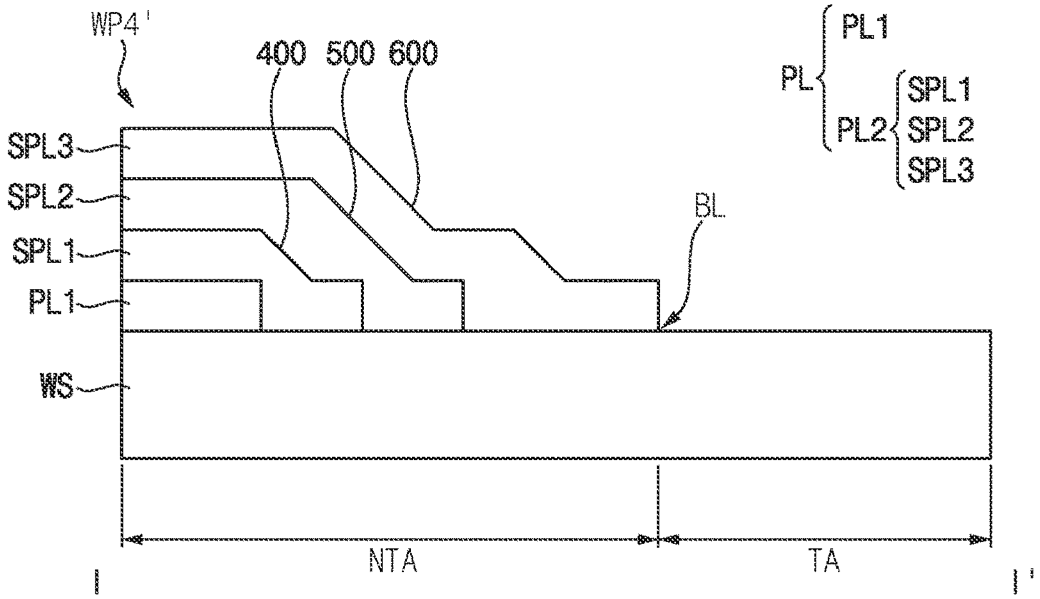

FIGS. 11 and 12 are schematic cross-sectional views illustrating a window panel taken along line I-I' of FIG. 1 according to an embodiment. For example, FIGS. 11 and 12 are schematic cross-sectional views illustrating embodiments in which the printing layer PL includes multiple printed layers of three or more. Hereinafter, descriptions overlapping with descriptions of the window panel WP described with reference to FIG. 2 will be omitted or simplified.

Referring to FIG. 11, according to an embodiment, a window panel WP4 may include the window substrate WS and the printed layer PL. The printed layer PL may include a first printed layer PL1 and a second printed layer PL2. The first printed layer PL1 may include a first sub-printed layer SPL1 and a second sub-printed layer SPL2. The second printed layer PL2 may include a third sub-printed layer SPL3 and a fourth sub-printed layer SPL4.

The first printed layer PL1 and the second printed layer PL2 may be disposed on the rear surface of the window substrate WS in the non-transmission area NTA. The front surface opposite to the rear surface of the window substrate WS may be a surface facing the user. The front surface of the window substrate WS may be referred to as an outer surface and the rear surface of the window substrate WS may be referred to as an inner surface.

The first sub-printed layer SPL1 may be disposed on the rear surface of the window substrate WS in the non-transmission area NTA. For example, the first sub-printed layer SPL1 may be disposed between the rear surface of the window substrate WS and the third sub-printed layer SPL3 in the non-transmission area NTA. The first sub-printed layer SPL1 may extend from the edge of the window substrate WS to a portion spaced apart from the boundary line BL. The length of the first sub-printed layer SPL1 may be greater than the length of the second sub-printed layer SPL2.

The third sub-printed layer SPL3 may define the boundary line BL that divides the transmission area TA and the non-transmission area NTA. For example, the third sub-printed layer SPL3 may overlap the entire non-transmission area NTA in a plan view. For example, the third sub-printed layer SPL3 may be disposed on the rear surface of the window substrate WS in the non-transmission area NTA and may cover the upper and side surfaces of the first sub-printed layer SPL1. Accordingly, a side surface 200 of the third sub-printed layer SPL3 may include an inclined surface inclined from the boundary line BL toward the edge of the window substrate WS. The side surface 200 of the third sub-printed layer SPL3 may be defined as a surface extending from the end of the upper surface of the third sub-printed layer SPL3 corresponding to the side surface of the first sub-printed layer SPL1 to the rear surface of the window substrate WS. The inclined surface of the third sub-printed layer SPL3 may have an inclined angle less than a right angle with respect to the rear surface of the window substrate WS.

The second sub-printed layer SPL2 may be disposed on the third sub-printed layer SPL3 in the non-transmission area NTA. For example, the second sub-printed layer SPL2 may be disposed between the third sub-printed layer SPL3 and the fourth sub-printed layer SPL4 in the non-transmission area NTA. The second sub-printed layer SPL2 may extend from the edge of the window substrate WS to a portion spaced apart from the boundary line BL. For example, the second sub-printed layer SPL2 may overlap a portion of the first sub-printed layer SPL1 in a plan view. For example, the length of the second sub-printed layer SPL2 may be less than the length of the first sub-printed layer SPL1.

The fourth sub-printed layer SPL4 may be disposed on the third sub-printed layer SPL3 in the non-transmission area NTA, and may cover the upper and side surfaces of the second sub-printed layer SPL2. For example, the length of the fourth sub-printed layer SPL4 may be greater than the length of the second sub-printed layer SPL2. The length of the fourth sub-printed layer SPL4 may be less than the length of the third sub-printed layer SPL3. Accordingly, a side surface 300 of the fourth sub-printed layer SPL4 may include an inclined surface inclined from the boundary line BL toward the edge of the window substrate WS. The side surface 300 of the fourth sub-printed layer SPL4 may be defined as a surface extending from the end of the upper surface of the fourth sub-printed layer SPL4 corresponding to the side surface of the second sub-printed layer SPL2 to the rear surface of the window substrate WS. The inclined surface of the fourth sub-printed layer SPL4 may have an inclined angle less than a right angle with respect to the rear surface of the window substrate WS.

In an embodiment, the inclined angle between the inclined surface of the fourth sub-printed layer SPL4 and the rear surface of the window substrate WS and the inclined angle between the inclined surface of the third sub-printed layer SPL3 and the rear surface of the window substrate WS may same.

In another embodiment, the inclined angle between the inclined surface of the fourth sub-printed layer SPL4 and the rear surface of the window substrate WS and the inclined angle between the inclined surface of the third sub-printed layer SPL3 and the rear surface of the window substrate WS may be different.

Referring to FIG. 12, according to an embodiment, a window panel WP4' may include the window substrate WS and the printed layer PL. The printed layer PL may include a first printed layer PL1 and a second printed layer PL2. The second printed layer PL2 may include a first sub-printed layer SPL1, a second sub-printed layer SPL2, and a third sub-printed layer SPL3 sequentially disposed.

The first printed layer PL1 may be disposed on the rear surface of the window substrate WS in the non-transmission area NTA. For example, the first printed layer PL1 may be disposed between the rear surface of the window substrate WS and the first sub-printed layer SPL1 in the non-transmission area NTA. The first printed layer PL1 may extend from the edge of the window substrate WS to a portion spaced apart from the boundary line BL.

The first sub-printed layer SPL1 may extend from the edge of the window substrate WS to a portion spaced apart from the boundary line BL. The first sub-printed layer SPL1 may be disposed on the rear surface of the window substrate WS in the non-transmission area NTA, and may cover the upper and side surfaces of the first printed layer PL1. Accordingly, a side surface 400 of the first sub-printed layer SPL1 may include an inclined surface inclined from the boundary line BL toward the edge of the window substrate WS. The side surface 400 of the first sub-printed layer SPL1 may be defined as a surface extending from the end of the upper surface of the first sub-printed layer SPL1 corresponding to the side surface of the first printed layer PL1 to the rear surface of the window substrate WS. The inclined surface of the first sub-printed layer SPL1 may have an inclined angle less than a right angle with respect to the rear surface of the window substrate WS.

The second sub-printed layer SPL2 may extend from the edge of the window substrate WS to a portion spaced apart from the boundary line BL. The second sub-printed layer SPL2 may be disposed on the rear surface of the window substrate WS in the non-transmission area NTA, and may cover the upper and side surfaces of the first sub-printed layer SPL1. Accordingly, a side surface 500 of the second sub-printed layer SPL2 may include an inclined surface inclined from the boundary line BL toward the edge of the window substrate WS. The side surface 500 of the second sub-printed layer SPL2 may be defined as a surface extending from the end of the upper surface of the second sub-printed layer SPL2 corresponding to the side surface 400 of the first sub-printed layer SPL1 to the window substrate WS. The inclined surface of the second sub-printed layer SPL2 may have an inclined angle less than a right angle with respect to the rear surface of the window substrate WS.

The third sub-printed layer SPL3 may define the boundary line BL that divides the transmission area TA and the non-transmission area NTA. For example, the third sub-printed layer SPL3 may overlap the entire non-transmission area NTA in a plan view. For example, the third sub-printed layer SPL3 may be disposed on the rear surface of the window substrate WS in the non-transmission area NTA, and may cover the upper and side surfaces of the second sub-printed layer SPL2. Accordingly, a side surface 600 of the third sub-printed layer SPL3 may include an inclined surface inclined from the boundary line BL toward the edge of the window substrate WS. The side surface 600 of the third sub-printed layer SPL3 may be defined as a surface extending from the end of the upper surface of the third sub-printed layer SPL3 corresponding to the side surface 500 of the second sub-printed layer SPL2 to the window substrate WS. The inclined surface of the third sub-printed layer SPL3 may have an inclined angle less than a right angle with respect to the rear surface of the window substrate WS.

In an embodiment, the inclined angle between the inclined surface of the first sub-printed layer SPL1 and the rear surface of the window substrate WS, the inclined angle between the inclined surface of the second sub-printed layer SPL2 and the rear surface of the window substrate WS, and the inclined angle between the inclined surface of the third sub-printed layer SPL3 and the rear surface of the window substrate WS may be equal.

In another embodiment, the inclined angle between the inclined surface of the first sub-printed layer SPL1 and the rear surface of the window substrate WS, the inclined angle between the inclined surface of the second sub-printed layer SPL2 and the rear surface of the window substrate WS, and the inclined angle between the inclined surface of the third sub-printed layer SPL3 and the rear surface of the window substrate WS may be different from each other.

In still another embodiment, two inclined angles among the inclined angle between the inclined surface of the first sub-printed layer SPL1 and the rear surface of the window substrate WS, the inclined angle between the inclined surface of the second sub-printed layer SPL2 and the rear surface of the window substrate WS, and the inclined angle between the inclined surface of the third sub-printed layer SPL3 and the rear surface of the window substrate WS may be same, and another inclined angle may be different from the two.

However, the disclosure is not limited thereto, and the window panel may include the printed layer PL having various multi-layer structures.

FIG. 13 is a schematic cross-sectional view illustrating a display device according to an embodiment.

Referring to FIG. 13, a display device DD according to an embodiment may include a display panel DP, an adhesive OCA, and the window panel WP. The window panel WP may include the printed layer PL and the window substrate WS. The display panel DP may include a substrate SUB, a transistor TR, an insulating structure IL, a pixel defining layer PDL, a light emitting element LE, and an encapsulation layer TFE. Also, the light emitting element LE may include a pixel electrode PE, an organic light emitting layer EML, and a common electrode CE.

The substrate SUB may include a transparent material or an opaque material. The substrate SUB may include a transparent resin material. In an embodiment, the substrate SUB may be a polyimide substrate, and the polyimide substrate may include a first organic layer, a first barrier layer, a second organic layer, etc. In another embodiment, the substrate SUB may include a quartz substrate, a synthetic quartz substrate, a calcium fluoride substrate, a fluorine-doped quartz substrate, a soda-lime substrate, a non-alkali glass substrate, etc. These may be used alone or in combination with each other.

The transistor TR may be disposed on the substrate SUB. For example, the transistor TR may include amorphous silicon, polycrystalline silicon, or a metal oxide semiconductor.

The metal oxide semiconductor may include a binary compound ($AB_x$), a ternary compound ($AB_xC_y$), a quaternary compound ($AB_xC_yD_z$), etc. including indium (In), zinc (Zn), gallium (Ga), tin (Sn), titanium (Ti), aluminum (Al), hafnium (Hf), zirconium (Zr), magnesium (Mg), etc. For example, the metal oxide semiconductor may include zinc oxide ($ZnO_x$), gallium oxide ($GaO_x$), tin oxide ($SnO_x$), indium oxide ($InO_x$), indium gallium oxide (IGO), indium zinc oxide (IZO), indium tin oxide. (ITO), indium zinc tin oxide (IZTO), indium gallium zinc oxide (IGZO), etc. These may be used alone or in combination with each other.

The insulating structure IL may be disposed on the substrate SUB. The insulating structure IL may cover the transistor TR. The insulating structure IL may include at least one inorganic insulating layer and at least one organic insulating layer. For example, the inorganic insulating layer may include silicon oxide ($SiO_x$), silicon nitride ($SiN_x$), silicon carbide ($SiC_x$), silicon oxynitride ($SiO_xN_y$), silicon oxycarbide ($SiO_xC_y$), etc. The organic insulating layer may include a photoresist, a polyacryl-based resin, a polyimide-based resin, a polyamide-based resin, a siloxane-based resin, an acrylic resin, an epoxy-based resin, etc. These may be used alone or in combination with each other.

The pixel electrode PE may be disposed on the insulating structure IL in a display area DA. The pixel electrode PE may be connected to the transistor through a contact hole formed by removing a portion of the insulating structure IL. For example, the pixel electrode PE may include a metal, an alloy, a metal nitride, a conductive metal oxide, a transparent conductive material, etc. These may be used alone or in combination with each other. In an embodiment, the pixel electrode PE may be referred to as an anode electrode.

The pixel defining layer PDL may be disposed on the insulating structure IL and the pixel electrode PE. The pixel defining layer PDL may cover both sides of the pixel electrode PE and expose an upper surface of the pixel electrode PE. The pixel defining layer PDL may include an organic material and/or an inorganic material. In an embodiment, the pixel defining layer PDL may include a photoresist, a polyacrylic resin, a polyimide-based resin, a polyamide-based resin, a siloxane-based resin, an acrylic resin, an epoxy-based resin, etc. These may be used alone or in combination with each other.

The organic light emitting layer EML may be disposed on the pixel electrode PE in the display area DA. For example, holes provided from the pixel electrode PE and electrons provided from the common electrode CE may be combined in the organic light emitting layer EML to form excitons, and as the excitons change from an excited state to a ground state, the organic light emitting layer EML may emit light. The organic light emitting layer EML may emit light having a specific color (e.g., red, green, and blue). However, the disclosure is not limited thereto.

The common electrode CE may be disposed on the organic light emitting layer EML and the pixel defining layer PDL. For example, the common electrode CE may include a metal, an alloy, a conductive metal oxide, a transparent conductive material, etc. These may be used alone or in combination with each other. For example, the common electrode CE may be referred to as a cathode electrode.

Accordingly, the light emitting element LE including the pixel electrode PE, the organic light emitting layer EML, and the common electrode CE may be disposed on the substrate SUB. The light emitting element LE may be disposed in the display area DA. The light emitting element LE may be electrically connected to the transistor TR.

The encapsulation layer TFE may be disposed on the common electrode CE. The encapsulation layer TFE may prevent impurities, moisture, and the like from penetrating into the light emitting element LE from the outside. The encapsulation layer TFE may include at least one inorganic encapsulation layer and at least one organic encapsulation layer. For example, the inorganic encapsulation layer may include silicon oxide, silicon nitride, silicon oxynitride, etc., and the organic encapsulation layer may include a cured polymer such as polyacrylate.

The adhesive OCA may be disposed on the encapsulation layer TFE to fix the window panel WP to the display panel DP. An optically clear adhesive tape ("OCA tape") may be used as the adhesive OCA to improve luminance and visibility of the display device DD. The adhesive OCA may include a material, and a refractive index of the material and a refractive index of the window substrate WS may be same. Accordingly, the adhesive OCA may improve visibility by reducing luminance loss of the display device DD and by removing optical noise from external light. The window substrate WS may include glass or a polymer resin such as a PMMA-base material and the adhesive OCA may include an acrylic-based optically clear adhesive tape.

An edge portion of the window substrate WS may include at least one printed layer PL. The printed layer PL may include an inorganic material and/or an organic material. For example, the organic material may include a photoresist, a polyacryl-based resin, a polyimide-based resin, a polyamide-based resin, a siloxane-based resin, an acryl-based resin, an epoxy-based resin, etc. These may be used alone or in combination with each other.

The printed layer PL may block external light. In an embodiment, the printed layer PL may include an inorganic material and/or an organic material including a black light blocking material. For example, the light blocking material may include black pigment, black dye, carbon black, etc. These may be used alone or in combination with each other. In another embodiment, the printed layer PL may have a color other than black.

In case that the thickness of the printed layer PL is increased, light blocking property may be improved. However, in case that the printed layers PL are formed on a same surface of the rear surface of the window substrate WS, adhesion failure may occur.

For example, in case that the adhesive OCA is attached to attach the window panel WP to the display panel DP, due to the offset of the printed layers PL, the adhesive OCA may be separated from the window substrate WS at a portion where the adhesive overlaps the printed layer PL stacked in a multi-layer structure. In case that the adhesive OCA is separated from the window substrate WS, bubble defect may occur in the portion. Such bubble defect may cause adhesion failure between the display panel DP and the window panel WP or touch failure of the touch sensor included in the display panel DP.

In the disclosure, in order to prevent this, the side surface of the printed layer PL may include an inclined surface inclined with respect to the rear surface of the window substrate WS in the non-transmission area NTA. As the side surface of the printed layer PL includes an inclined surface, the adhesive OCA may be entirely formed on the side surface of the printed layer PL, and the display panel DP may be tightly bonded to the window panel WP. Accordingly, bubble defect that may occur in the vicinity between the non-transmission area NTA and the transmission area TA due to the offset of the printed layer PL may be prevented. Also, since the side surface of the printing layer PL includes an inclined surface, a thin adhesive OCA may be used.

The window panel WP shown in FIG. 13 may correspond to any one of the window panels WP, WP1, WP1', WP2, WP2', WP2'', WP3, WP3', WP3'', WP4, and WP4' shown in FIGS. 2, 3, 4, 5, 6, 7, 8, 9, 10, 11, and 12.

Although the display device DD of the disclosure is described as an organic light emitting display device (OLED), the disclosure is not limited thereto. In other embodiments, the display device DD may include a liquid crystal display device (LCD), a field emission display device (FED), a plasma display device (PDP), an electrophoretic display device (EPD), an inorganic light emitting display device (ILED), or a quantum dot display device.

The disclosure can be applied to various display devices. For example, the disclosure can be applied to various display devices such as display devices for vehicles, ships and aircraft, portable communication devices, display devices for exhibition or information transmission, medical display devices, and the like.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A window panel comprising:

a window substrate including a transmission area through which light is transmitted and a non-transmission area adjacent to the transmission area;

a first printed layer disposed on a surface of the window substrate in the non-transmission area; and a second printed layer covering upper and side surfaces of the first printed layer, disposed in the non-transmission area, and defining a boundary line between the transmission area and the non-transmission area, wherein the second printed layer includes a first sub-printed layer and a second sub-printed layer, the first sub-printed layer covers the upper and side surfaces of the first printed layer, and the second sub-printed layer covers upper and side surfaces of the first sub-printed layer.

2. The window panel of claim 1, wherein the non-transmission area includes a first non-transmission area adjacent to the transmission area and a second non-transmission area adjacent to an edge of the window substrate, and a side surface of the second printed layer includes an inclined surface inclined with respect to the surface of the window substrate in the first non-transmission area.

3. The window panel of claim 2, wherein the inclined surface is a concave surface having a gradually increasing inclined angle with respect to the surface of the window substrate from the boundary line toward the second non-transmission area.

4. The window panel of claim 2, wherein the inclined surface is a convex surface having a gradually decreasing inclined angle with respect to the surface of the window substrate from the boundary line toward the second non-transmission area.

5. The window panel of claim 2, wherein the window substrate includes a curved surface such that the surface of the window substrate is concave in the non-transmission area.

6. The window panel of claim 5, wherein the inclined surface is a concave surface having a gradually increasing inclined angle with respect to the surface of the window substrate from the boundary line toward the second non-transmission area.

7. The window panel of claim 5, wherein the inclined surface is a convex surface having a gradually decreasing inclined angle with respect to the surface of the window substrate from the boundary line toward the second non-transmission area.

8. The window panel of claim 2, wherein the window substrate includes a curved surface such that the surface of the window substrate is convex in the non-transmission area.

9. The window panel of claim 8, wherein the inclined surface is a concave surface having a gradually increasing inclined angle with respect to the surface of the window substrate from the boundary line toward the second non-transmission area.

10. The window panel of claim 8, wherein the inclined surface is a convex surface having a gradually decreasing inclined angle with respect to the surface of the window substrate from the boundary line to the second non-transmission area.

11. The window panel of claim 1, wherein each of the first printed layer and the second printed layer includes an inorganic material or an organic material including a black light blocking material.

12. The window panel of claim 1, wherein the second printed layer further includes a third sub-printed layer, the first sub-printed layer, the second sub-printed layer, and the third sub-printed layer are sequentially disposed, and the third sub-printed layer covers upper and side surfaces of the second sub-printed layer.

13. A window panel comprising:

a window substrate including a transmission area through which light is transmitted and a non-transmission area adjacent to the transmission area;

a first printed layer disposed on a surface of the window substrate in the non-transmission area; and a second printed layer covering upper and side surfaces of the first printed layer, disposed in the non-transmission area, and defining a boundary line between the transmission area and the non-transmission area, wherein the first printed layer includes a first sub-printed layer and a second sub-printed layer disposed on the first sub-printed layer, the second printed layer includes a third sub-printed layer and a fourth sub-printed layer disposed on the third sub-printed layer, the third sub-printed layer covers upper and side surfaces of the first sub-printed layer, and the fourth sub-printed layer covers upper and side surfaces of the second sub-printed layer.

14. A display device comprising:

a display panel including a display area including a pixel and a non-display area disposed adjacent to the display area;

a window substrate including a transmission area corresponding to the display area and a non-transmission area corresponding to the non-display area;

a first printed layer disposed on a surface of the window substrate in the non-transmission area; and a second printed layer covering upper and side surfaces of the first printed layer, disposed in the non-transmission area, and defining a boundary line between the transmission area and the non-transmission area, wherein the second printed layer includes a first sub-printed layer and a second sub-printed layer, the first sub-printed layer covers the upper and side surfaces of the first printed layer, and the second sub-printed layer covers upper and side surfaces of the first sub-printed layer.

15. The display device of claim 14, wherein the non-transmission area includes a first non-transmission area adjacent to the transmission area and a second non-transmission area adjacent to an edge of the window substrate, and a side surface of the second printed layer includes an inclined surface inclined with respect to the surface of the window substrate in the first non-transmission area.

16. The display device of claim 14, wherein each of the first printed layer and the second printed layer includes an inorganic material or an organic material including a black light blocking material.

17. The display device of claim 14, wherein the window substrate includes a curved surface such that the surface of the window substrate is concave in the non-transmission area.

18. The display device of claim 14, wherein the window substrate includes a curved surface such that the surface of the window substrate is convex in the non-transmission area.

19. The display device of claim 14, wherein the second printed layer further includes a third sub-printed layer, the first sub-printed layer, the second sub-printed layer, and the third sub-printed layer are sequentially disposed, and the third sub-printed layer covers upper and side surfaces of the second sub-printed layer.

* * * * *